(12) United States Patent
Hart

(10) Patent No.: US 8,910,691 B2
(45) Date of Patent: Dec. 16, 2014

(54) GLASS HANDLING ASSEMBLY

(75) Inventor: Brad J. Hart, Lakewood, CO (US)

(73) Assignee: First Solar, Inc., Tempe, AZ (US)

( * ) Notice: Subject to any disclaimer, the term of this patent is extended or adjusted under 35 U.S.C. 154(b) by 310 days.

(21) Appl. No.: 13/433,940

(22) Filed: Mar. 29, 2012

(65) Prior Publication Data

US 2013/0255886 A1    Oct. 3, 2013

(51) Int. Cl.
| | | |
|---|---|---|
| B29C 65/50 | (2006.01) |
| B32B 37/10 | (2006.01) |
| B32B 38/18 | (2006.01) |
| B32B 39/00 | (2006.01) |
| B32B 43/00 | (2006.01) |
| B65G 47/22 | (2006.01) |
| B65G 47/24 | (2006.01) |

(52) U.S. Cl.
USPC .................... 156/538; 156/582; 198/345.3

(58) Field of Classification Search
USPC ............ 156/538, 580, 582; 198/345.1, 345.3
See application file for complete search history.

(56) References Cited

U.S. PATENT DOCUMENTS 4,366,013 A * 12/1982 Valimont et al. ............... 156/102

FOREIGN PATENT DOCUMENTS

| GB | 1260117 A | * | 1/1972 | ............ B65G 49/06 |
| GB | 1472518 A | * | 5/1977 | ............ B32B 17/10 |
| JP | 06227653 A | * | 8/1994 | ............ B65G 47/88 |

OTHER PUBLICATIONS

English Abstract of JP 06-227653 (Apr. 2, 2014).*
Machine English Translation of JP 06-227653 (Apr. 2, 2014).*

* cited by examiner

Primary Examiner — Sing P Chan
(74) Attorney, Agent, or Firm — MacMillan, Sobanski & Todd, LLC

(57) ABSTRACT

Assemblies are provided for stabilizing sheets of glass during handling. The assemblies may include rollers of different varieties for stabilization. Crowder rollers may be provided to contact edges of the sheets. One or more of the crowder rollers may have an outer surface having a noncylindrical portion with an increasing diameter in an upward direction relative to the conveyance plane of the sheets. Conveyor rollers may be arranged so as to define a conveyor for conveying the sheets. One or more of the conveyor rollers may be a support roller in substantial registration with a strip applicator for contacting a bottom side of the sheets below the strip applicator during application of a strip.

20 Claims, 7 Drawing Sheets

GLASS HANDLING ASSEMBLY

FIELD OF THE INVENTION

The present disclosure relates generally to assemblies for handling glass sheets, in particular assemblies for handling glass sheets to which strips of material are applied.

BACKGROUND OF THE INVENTION

Glass sheets are often used as portions of photovoltaic devices. In thin-film-based photovoltaic devices, for example, a sheet of glass is provided and then a number of layers are applied. The layers may be deposited, etched, scribed, etc., in various steps. Typically, glass sheets used in, e.g., CdTe-based photovoltaic devices may be in the range of about 0.5-5 millimeters thick, and the coating layers are on the order of just a few microns. To save on material costs and to improve transmissibility, glass sheets used in such photovoltaic devices have become thinner and thinner. Accordingly, the glass sheets are fragile and must be handled with care to avoid breakage during the various fabrication steps.

As part of the fabrication process, strips or ribbons of material may be applied to such glass sheets for various reasons. For example, edge protective strips, conductor strips, and/or insulating strips may be applied to the glass sheets in various arrangements. Typically, such strips are applied from a roll of material via a dispensing head in a machine assembly that controls relative movement of the head and glass to place the strips, as desired. However, as the glass sheets have become thinner, processing the sheets through the dispensing head machinery creates the possibility of higher incidents of breakage. This is particularly true in connection with application of such strips, where often dispensing heads push down onto a glass sheet surface, and the glass sheets can be subjected to various opposing forces, bending forces, etc., as part of such a step.

Accordingly, a device for handling glass sheets that avoids one or more issues with conventional sheet handling devices or that provides other benefits would be welcome.

BRIEF DESCRIPTION OF THE INVENTION

Aspects and advantages of the disclosure will be set forth in part in the following description, or may be obvious from the description, or may be learned through practice of the embodiments disclosed.

According to certain aspects of the disclosure, an assembly is provided for stabilizing a sheet of glass during application of a strip by a strip applicator. The assembly may include, for example, a series of conveyor rollers arranged so as to define a conveyor for conveying the sheet into and within a strip application zone. Each conveyor roller may have a central conveyance axis, the respective central conveyance axes of the conveyor rollers extending substantially parallel to each other along a conveyance plane. At least one pair of crowder rollers may also be provided, each crowder roller having a central crowder axis extending substantially perpendicular to the conveyance plane. Each crowder roller may be respectively positionable so as to contact a given edge of the sheet to register the sheet in the strip application zone relative to the strip applicator. At least one of the crowder rollers may have an outer surface having a noncylindrical portion, the noncylindrical portion having an increasing diameter in an upward direction relative to the conveyance plane. The noncylindrical portion may provide a counteracting downward force to the respective given edge of the sheet if operation of the strip applicator causes an upward force at the respective given edge of the sheet, thereby maintaining the sheet in a substantially planar condition. Various options and modifications are possible.

According to certain other aspects of the invention, an assembly is provided for stabilizing a sheet of glass during application of a strip by a strip applicator. The assembly may include, for example, a series of conveyor rollers arranged so as to define a conveyor for conveying the sheet into and within a strip application zone, each conveyor roller having a central conveyance axis. The respective central conveyance axes of the conveyor rollers may extend substantially parallel to each other along a conveyance plane. One of the conveyor rollers may be a support roller in substantial registration with the strip applicator for contacting a bottom side of the sheet below the strip applicator during application of the strip. The support roller may provide a counteracting upward force to the bottom side of the sheet if operation of the strip applicator causes a downward force, thereby maintaining the sheet in a substantially planar condition. As above, various options and modifications are possible.

These and other features, aspects and advantages of the present disclosure will become better understood with reference to the following description and appended claims. The accompanying drawings, which are incorporated in and constitute a part of this specification, illustrate embodiments and aspects of the disclosure and, together with the description, serve to explain the principles of the disclosure.

BRIEF DESCRIPTION OF THE DRAWINGS

A full and enabling disclosure of the various aspects of the present invention, including the best mode thereof, directed to one of ordinary skill in the art, is set forth in the specification, which makes reference to the appended figures, in which.

DETAILED DESCRIPTION OF THE INVENTION

Figure 1:
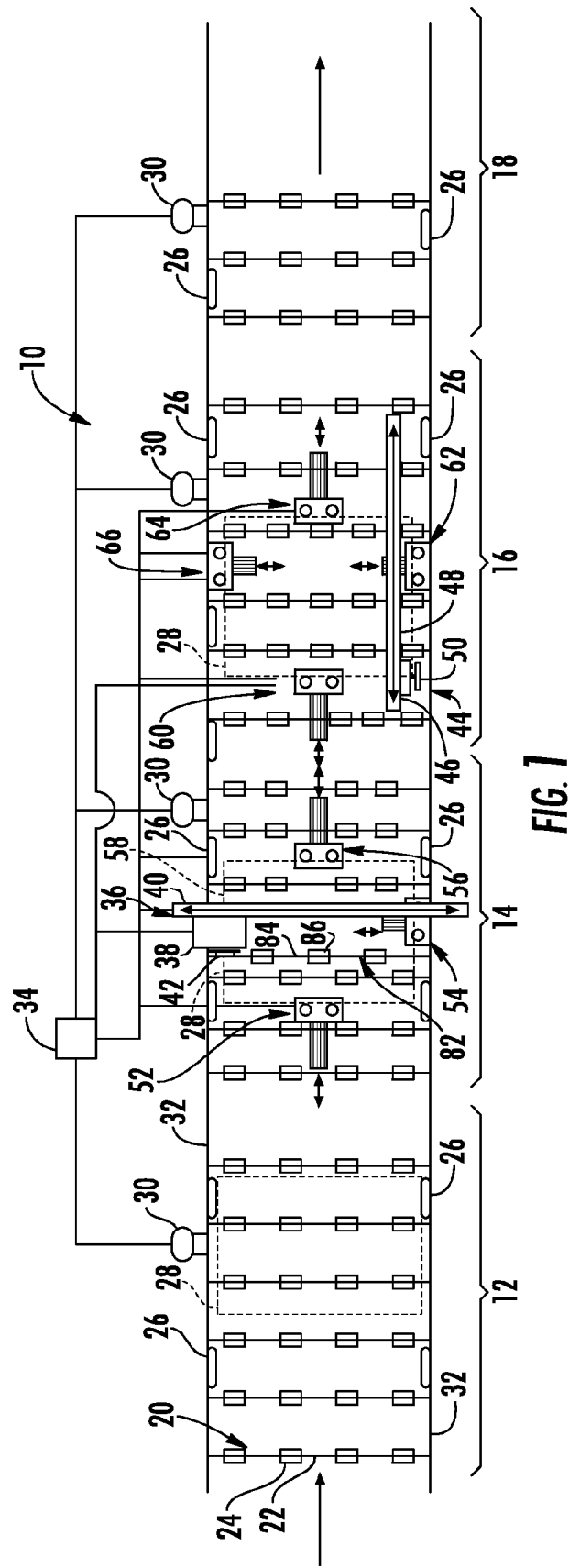
FIG. 1 is a diagrammatical view of a strip applying and glass handling assembly, viewed from above, showing one cross-machine application and one machine direction application.

Reference now will be made in detail to embodiments of the disclosure, one or more examples of which are illustrated in the drawings. Each example is provided by way of explanation of the invention, not limitation of the invention. In fact, it will be apparent to those skilled in the art that various modifications and variations can be made in the present disclosure without departing from the scope or spirit of the invention. For instance, features illustrated or described as part of one embodiment can be used with another embodiment to yield a still further embodiment. Thus, it is intended that the present invention includes all such modifications and variations to the present disclosure as come within the scope of the appended claims and their equivalents.

As shown in FIG. 1, a glass handling assembly 10, generally in the form of a roller conveyor, includes an upstream feed station 12, a first strip application station 14, a second strip application station 16, and a downstream feed station 18. It should be understood that the exemplary glass handling assembly 10 is but one example and various different arrangements could be employed with differing numbers and arrangements of strip application stations.

Conveyor roller assemblies 20 are provided throughout handling assembly 10. Each conveyor roller assembly 20 includes an axle 22 and at least one conveyor roller 24. As shown, four conveyor rollers 24 are provided on each axle 22, but other numbers of conveyor rollers could be used, as well as other axial lengths. Axles 22 each have a conveyor axis 25 located along a substantially horizontal conveyance plane 80 (See FIG. 4). Side guides 26 may be provided throughout glass handling assembly 10 as well.

Glass sheets 28 are moved (from left to right in FIG. 1) though glass handling assembly 10 for application of strips 43 and 53 (e.g., conductive, insulating, or sealing tapes, as needed) in strip applying stations 14 and 16. Sheets 28 may, for example, be moved by motors 30 that can drive one or more of the conveyor roller assemblies 20 in each station 12, 14, 16, 18. If desired, multiple conveyor roller assemblies 20 may be joined by a conventional gearing, chains and the like (not shown) so as to rotate together at a given conveyance speed and force. Such structure could be mounted on one or both sides 32 of glass handling assembly 10. Some or all of the conveyor roller assemblies 20 in each station 12, 14, 16 or 18 could thus be driven, as desired, by virtue of motors 30, as controlled by a conventional programmable logic controller 34.

Figure 2:
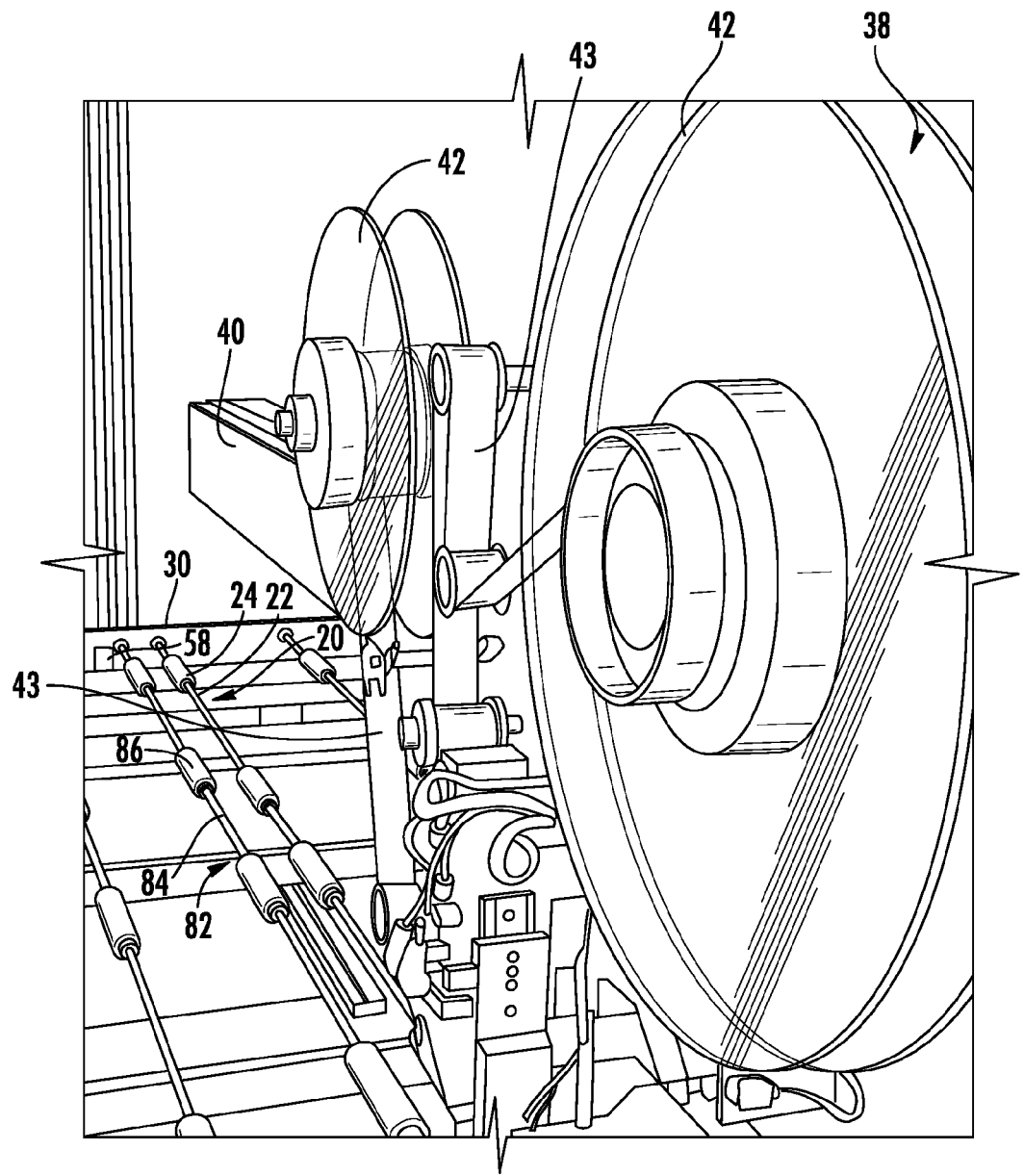
FIG. 2 is a perspective view of a cross-machine strip applying and glass handling assembly as in FIG. 1.

Strip applying station 14 includes a strip applicator assembly 36 including a head assembly 38 movable along a rail 40. Reel 42 on head assembly 38 provides a material to be applied as a strip 43 on sheets 28. It should be understood that more than one reel 42 could be employed, so that, for example, two strips 43 could be applied from two reels 42 on one head assembly 38, as shown in FIG. 2. Head assembly 38 may include within it a drive mechanism for driving itself along rail 40 when strips 43 are applied from reel 42, as controlled by controller 34. Such a drive may be a conventional servo motor, hydraulic system, pneumatic system, as desired. Suitable strip applicator head assemblies such as head assembly 38 are available from sources such as NPC, Inc. of Tokyo, Japan. However, it should be understood that other strip applicators could be employed. Controller 34 drives head assembly 38 along rail 40 to apply the strip when a sheet 28 is properly registered with head assembly 38 and rail 40. Controller 34 may also cause head assembly 38 to lift or drop relative to sheet 28, to employ a cutter, etc., as is conventional to complete application of a strip.

Figure 4:
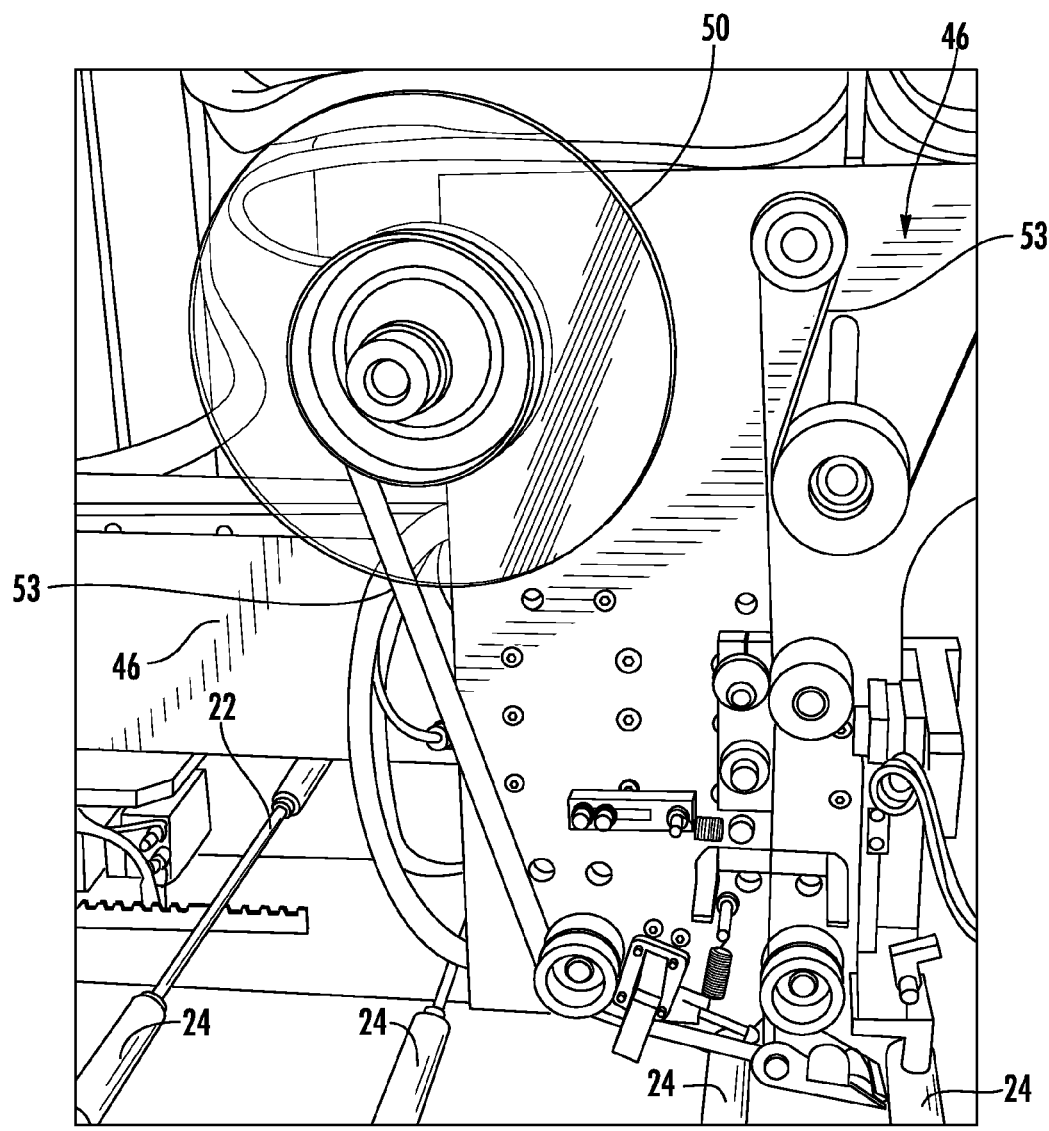
FIG. 4 is a perspective view of a machine direction strip applying and glass handling assembly as in FIG. 1.
Figure 5:
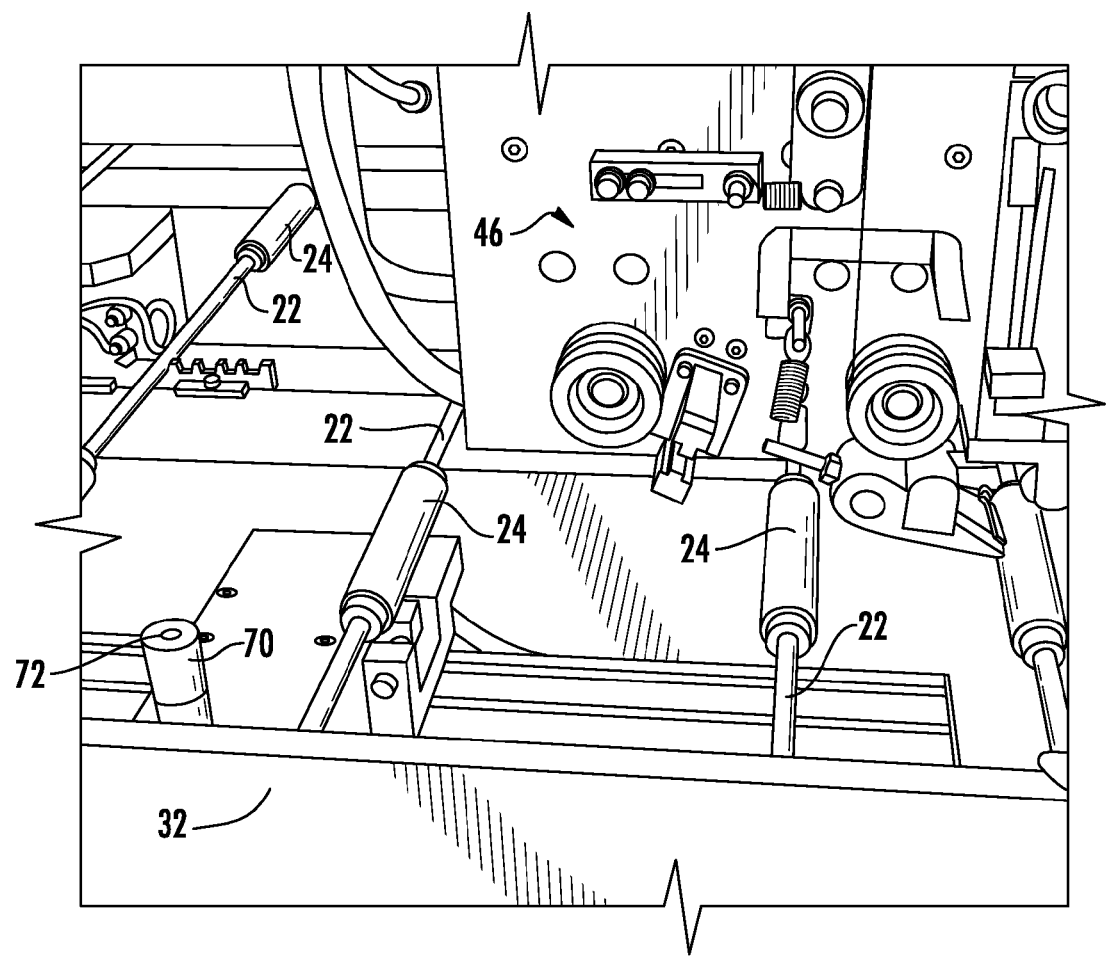
FIG. 5 is a closeup perspective view of a portion of the assembly of FIG. 4.

Strip applying station 16 includes a strip applicator assembly 44 including a head assembly 46 movable along a rail 48 to dispense a strip 53 of material from a reel 50 (see FIG. 4). Strip applicator head assembly 46 moves along its rail 48 in a machine direction (along the direction that sheets 28 are moved). Strip applicator head assembly 38 moves along its rail 40 in a cross-machine (lateral) direction. It should be understood however that rails 40 could be oriented in any direction (including directions skewed from the machine and cross-direction), and the rails need not be linear, as dictated by the desired location of the strip to be placed along the sheet. As shown in FIG. 4, if desired head assembly 46 can include two reels 50 for dispensing two strips 53.

Crowder roller assemblies are located throughout glass handling assembly 10 for positioning sheets 28 relative to strip applicator head assemblies 38 and 46. As shown in FIG. 1, crowder roller assemblies 52, 54, 56 and 58 are provided in strip applying station 14 (assembly 58 is hidden beneath head assembly 38), and crowder roller assemblies 60, 62, 64 and 66 are provided in strip applying station 16. Each crowder roller assembly includes at least one crowder roller 70 rotatably mounted, via an axle 72, to a block 74 and/or 76 depending on desired functionality. If desired for added stability, crowder rollers 70 may be mounted in pairs to a block 74 and/or 76. Crowder roller axles 72 extend substantially perpendicular to the conveyance plane defined by conveyor roller axles 22. Each crowder roller 70 may be positioned so as to contact a given edge of a sheet 28 to register the sheet in strip application zone within strip applying stations 14 or 16.

Figure 6:
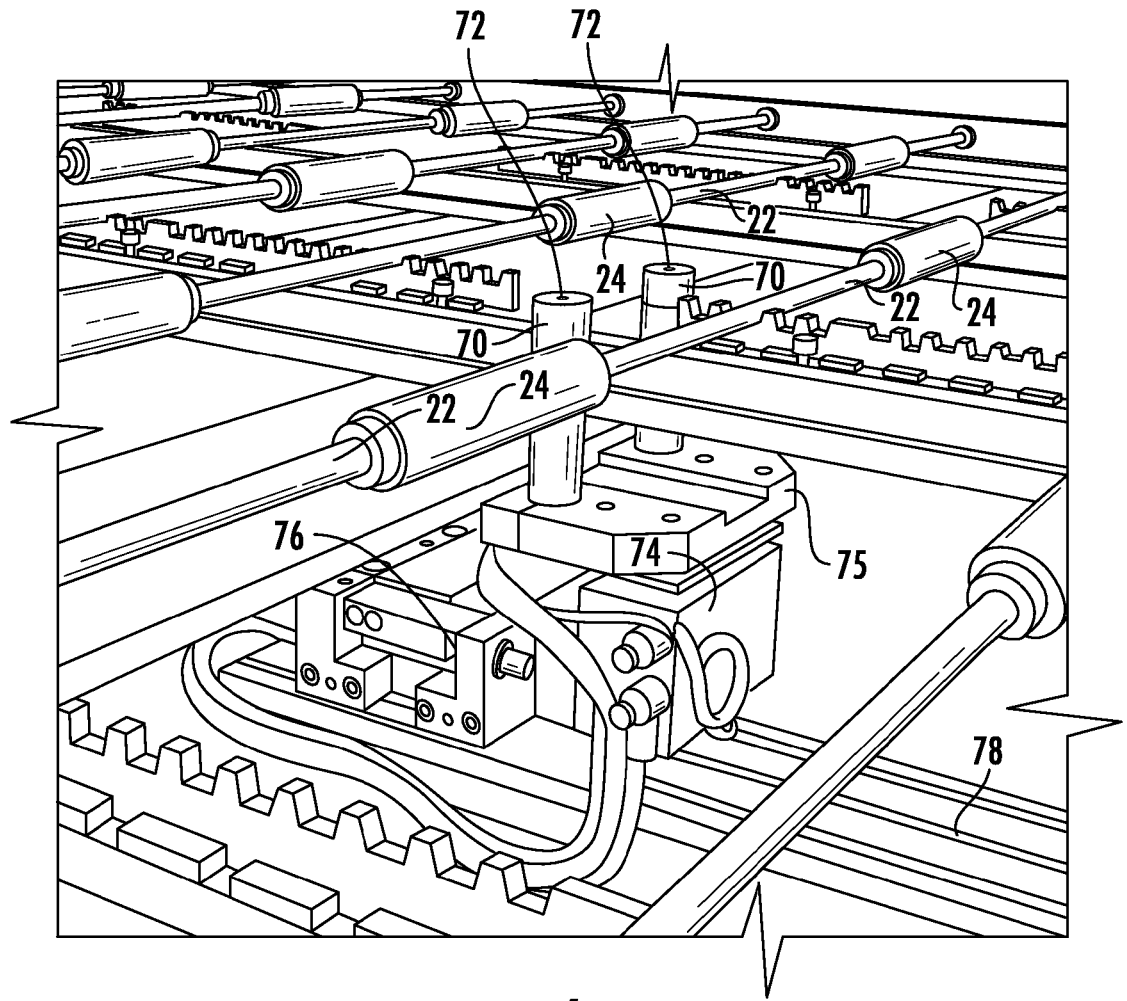
FIG. 6 a side perspective view of a crowder roller assembly according to certain aspects of the disclosure.

It may be desired to move one or more of crowder rollers 70 either or both vertically and horizontally relative to the sheets 28 being transported to position the sheets. Accordingly, a crowder roller 70 may be mounted to first block 74 so as to be movable vertically. Vertical movement can be achieved with an actuator of various types. For example, as shown in FIG. 6, crowder rollers 70 can be mounted to a plate 75 that is moveable relative to block 74 via actuating structure. Such structure could comprise a pneumatic, hydraulic, or servo-motor driven actuator housed within block 74 for moving plate 75 relative to block 74. Alternatively, an actuator can be provided, for example within block 74, for moving block 74 relative to block 76.

Vertical movement of a given crowder roller 70 allows the crowder roller to retract to a position below the conveyance plane of sheets 28 so that the sheets can be driven past the crowder roller when desired. Such vertical motion may be useful, e.g., for one or more of upstream and downstream crowder roller assemblies 52, 56, 60 and 64. After the sheet 28 passes the location of the given crowder roller assembly, blocks 74 can be moved upward again to lift the respective crowder roller(s) 70 into a position whereby sides of the crowder rollers 70 can contact edges of sheets 28.

Horizontal movement may also be provided to a given crowder roller 70 by an actuator that moves the crowder roller horizontally, for example, along a track 78. Such movement can be provided by an actuator within a block such as block 76 that interfaces with track 78. As above, the actuator could be a pneumatic, hydraulic, or servo-motor driven device, and it could be housed at least partially within block 76.

Alternatively, the crowder rollers 70 may be movable only vertically (thereby eliminating the need for block 76 and track 78), or each block 74 may be movable only horizontally along a track (thereby eliminating the need for block 76).

Various methods may be used to register sheets 28 in the application zone relative to the strip applicator head assemblies 38 and 46 using the crowder roller assemblies. Using strip applying station 16 as an example, the crowder roller(s) 70 of only one of the assemblies, e.g., downstream crowder roller assembly 64, could move only vertically (not along tracks). Once a sheet 28 is driven by conveyor roller assemblies 20 to the general vicinity of crowder roller assembly 64 (which could be detected by a sensor on crowder roller assembly 64 or elsewhere in strip applying station 16), crowder roller(s) 70 of crowder roller assembles 60, 62 and 66 could be simultaneously or sequentially driven along the respective rails to contact sheet edges and position the sheet in a desired location between the four assemblies 60, 62, 64 and 66. For a known sheet size, if the horizontal position of one crowder roller 70 (e.g, the roller on downstream crowder roller assembly 64) is fixed, and another of the crowder roller assemblies (e.g., assembly 66) is moved horizontally so that its crowder roller 70 is moved to a known position, then positioning the other two crowder roller assemblies 60 and 62 will register the sheet as desired relative to strip applicator assembly 44. In other words, with a known sheet dimension and two known predetermined positions of sheet edges as defined by crowder roller positions, the sheet can be accurately positioned.

The preceding example describes having one crowder roller assembly 64 that moves only vertically. Such arrangement is done to simplify the machine by avoiding the need for horizontal actuation of the respective crowder roller 70 of crowder roller assembly 64. Also, no horizontal position measurement and possible feedback to a controller would be needed for such crowder roller assembly 64 since its horizontal position is fixed and known. It would be also be possible to use vertical motion only with two of the crowder roller assemblies 60,62,64,66, further simplifying the device. If two of the crowder roller assembles were moved vertically only, then such assemblies should be adjacent (e.g., assemblies 64 and 66) and not opposing (e.g., assemblies 60 and 64) to prevent binding or deflection of a sheet 28 when the respective roller assemblies operate. It would also be possible to employ vertical motion only on none of the crowder roller assemblies, however, such would require moving the upstream and downstream crowder rollers a greater distance to clear sheets 28 as they travel along the assembly. As desired, it would be therefore possible to use horizontal motion to position from zero to four of the crowder roller assemblies 60,62,64,66, whether or not zero, one or two of the crowder roller assemblies are moved vertically.

Various other elements can be used alone or in combination to assist in handling the glass sheets 28 to help avoid breaking thereof. For example, as shown in FIG. 2, strip applying station 14 may include a support roller assembly 82 for additional support in registration with a line along which a strip applicator head assembly such as 38 moves. Support roller assembly 82 may include an axle 84 and support rollers 86 for supporting sheet 28 beneath head assembly 38 as strips are applied. Support roller axles 84 are substantially coplanar with conveyor roller axles 22. Support rollers 86 may be idler or driven rollers. Support rollers 86 are in registration with strip applicator head assembly 38 for contacting a bottom side of sheet 28 during application of the strip 43. Certain strip applicators 36 may include a structure, such as a roller 45, that pushes down on sheet 28 to assist in applying the strip 43 to a top side of the sheet. A support roller 86 may be substantially aligned in registration with such structure.

Figure 3:
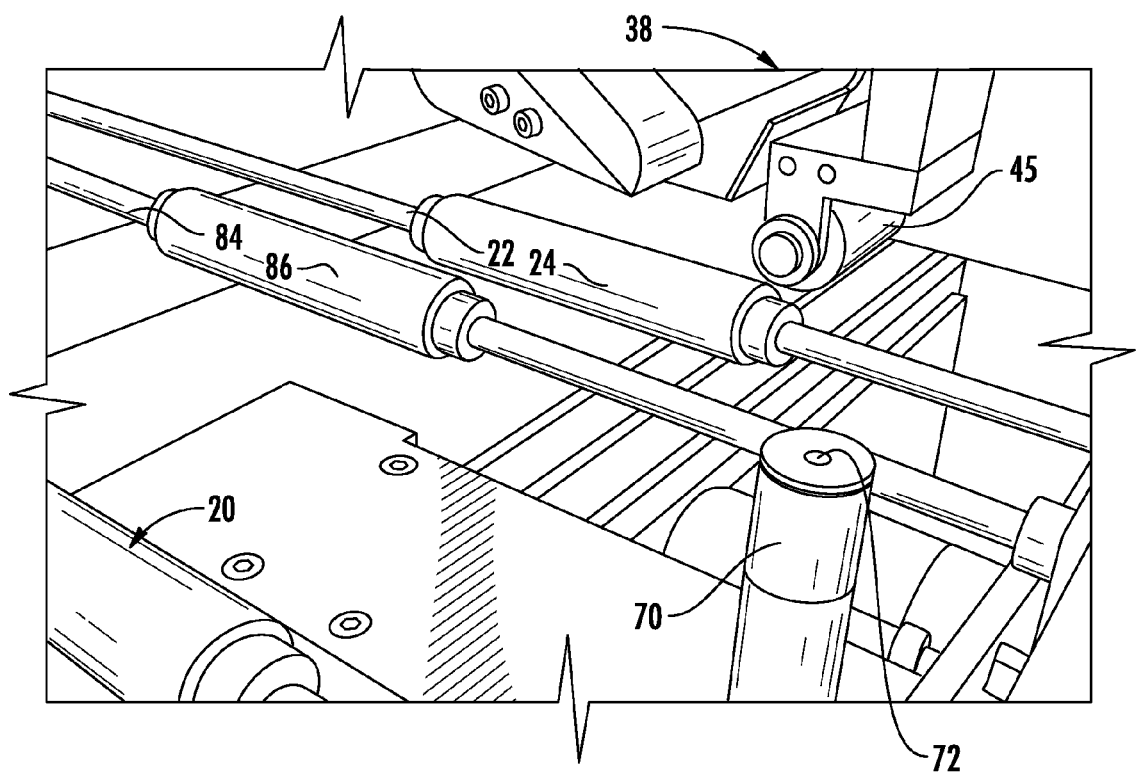
FIG. 3 is a closeup perspective view of a portion of the assembly of FIG. 2.

If desired, a single support roller assembly 82 may be provided beneath a strip applicator 36. However, as shown in FIGS. 2 and 3, support roller assembly 82 may be placed near another roller assembly (in the case conveyor roller assembly 20). In this case, the particular conveyor roller assembly 22 adjacent support roller assembly 82 may also be considered a support roller assembly as well. Thus, two or more support roller assemblies 82 may be provided along the cross-machine direction or machine direction in substantial registration with head assembly 38. With two support roller assemblies, the axes of the respective rollers may be spaced apart wide enough to support the sheet in view of the width of the strip being applied. As shown, the center axes of roller assemblies 82 and 22 in FIGS. 2 and 3 are located apart a distance slightly greater than the width of strips 43 and/or the width or roller 45. The spacing of axes in this example is approximately 22 mm, and generally centered with each axis to a respective side of a centerline of action along with the strip 43 are to be applied. However other spacings could be used, wider than the strip, narrower than the strip or equal to it, in a given application. Also, only one, or more than two support roller assemblies could be used along a given strip applicator line of action. Use of such a support roller assembly 82 at such location balances forces and inhibits bending or binding along the region of the sheet at which a given strip is being applied. Accordingly, support roller assembly 82 provides a counteracting upward force to the bottom side of sheet 28 if operation of the strip applicator assembly 36 causes a downward force, thereby maintaining the sheet in a substantially planar condition. By providing support at such location, perhaps but not necessarily in addition to the support provided by conveyor roller assemblies and/or respective crowder roller assemblies, sheets are more securely handled.

In strip applying station 16, conveyor roller assemblies 20 extend with their axles 22 perpendicular to the direction in which head assembly 46 moves. Accordingly, as an alternative to adding a support roller assembly 82 in such location, certain of the rollers 24 on axles 22 in such strip applying station 16 can be arranged so as to be in registration beneath head assembly 46 for additional support.

Figure 7:
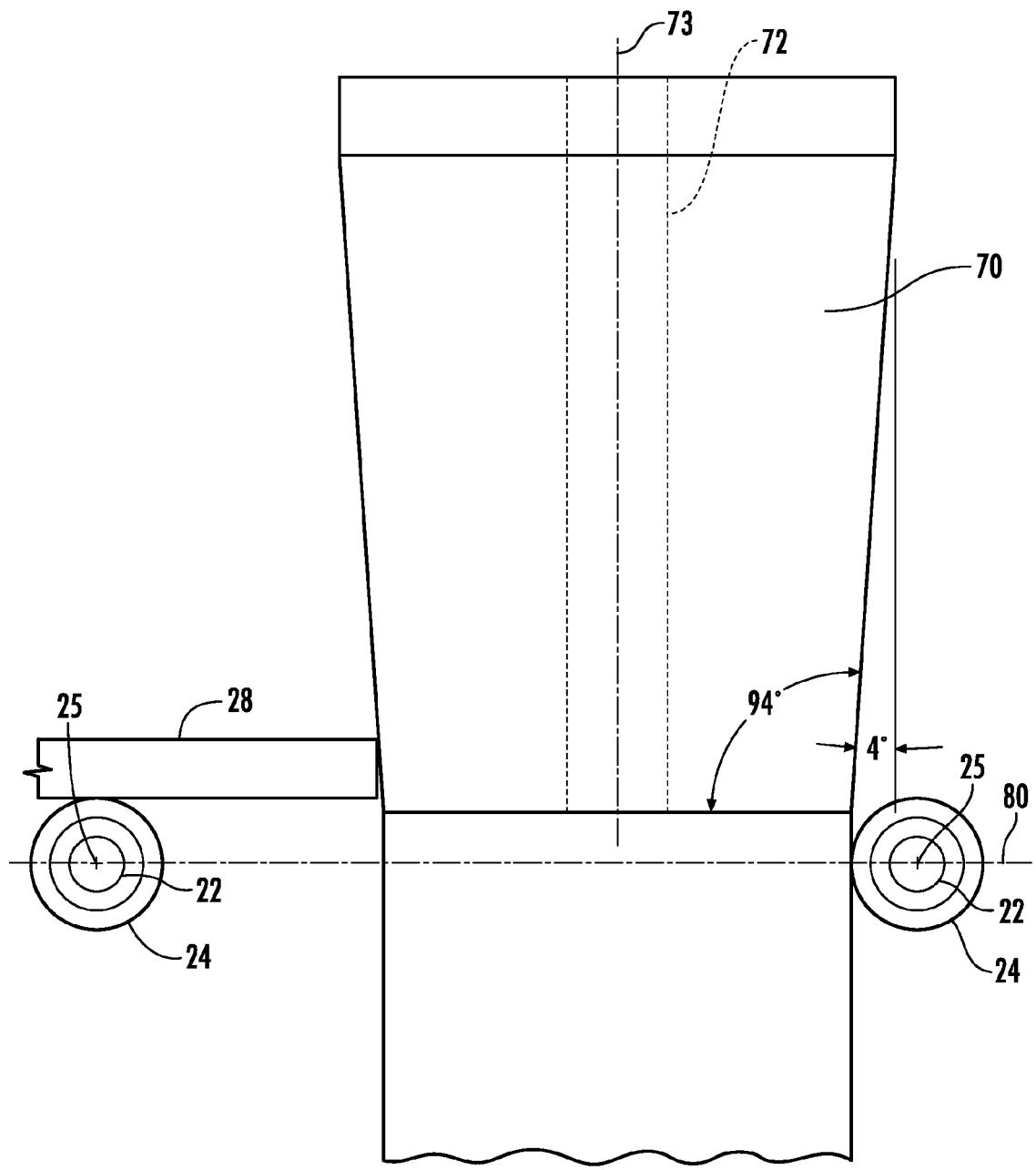
FIG. 7 is a side view of a crowder roller.

As shown in FIGS. 6 and 7, crowder roller 70 is mounted on axle 72 having a central crowder axis 73 extending substantially perpendicular to the conveyance plane 75. Also, as shown in FIGS. 6 and 7, one or more of the crowder rollers 70 may have a slight taper (e.g., angled or curved). Roller 70 has, in the illustrated embodiment, a conical taper of about 4 degrees from the horizontal with the radius of the roller increasing in an upward direction. Roller 70 therefore has a noncylindrical outer surface portion 77 having an increasing diameter in an upward direction relative to conveyance plane 80. The entire outer surface of roller 70 need not be tapered; a taper could be provided only where contact with a sheet 28 is expected. Roller 70 (as well as support rollers 86 and conveyor rollers 24) may be formed of a material such as UHMW polyethylene, so as to prevent binding or breaking the sheets, although various other roller materials could be used.

Such taper assists in keeping sheets 28 in place atop conveyor roller assemblies 20. For example, at the end of applying a strip such as an adhesive-backed insulation layer, head assembly 38 will move upward and the strip will be cut. Such upward movement can cause a lifting force to be applied to the sheet in some situations. Also, if a head assembly 38 pushes down on a central portion of a sheet, the sheet could bend downward near the head assembly and further contact with roller assemblies beneath the sheet could cause edges of the sheet to bend upwards. Accordingly, the noncylindrical, tapered portion 77 provides a counteracting downward force to the edge of sheet 28 at the point of contact if operation of the strip applicator causes an upward force at edge, thereby maintaining the sheet in a substantially planar condition.

One or more or all of such crowder rollers 70 may include such a conical or other curved taper if desired. For example, only the crowder roller or rollers closest to the head assembly 38 may include such a noncylindrical taper, or any combination of the crowder rollers may include such a taper. Also, it should be understood that each crowder roller assembly need not have two rollers as shown. The crowder roller assemblies could have one or more crowder rollers, and the rollers could be spread apart further than shown. Crowder rollers along a given edge of a sheet could also be independently driven rather than commonly driven. Also, some of the crowder rollers along a lateral edge of the sheet path could be fixed in place, functioning simply as idler rollers to guide the sheets so that only three crowder roller assemblies need to be moved into position. Therefore, many options and modifications may exist through the utilization of various combinations of the elements disclosed above, and such combinations are considered to be within the scope of the present invention.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. An assembly for stabilizing a sheet of glass during application of a strip by a strip applicator, the assembly comprising:
a series of conveyor rollers arranged so as to define a conveyor for conveying the sheet into and within a strip application zone, each conveyor roller having a central conveyance axis, the respective central conveyance axes of the conveyor rollers extending substantially parallel to each other along a conveyance plane; and
at least one pair of crowder rollers, each crowder roller having a central crowder axis extending substantially perpendicular to the conveyance plane, each crowder roller being respectively positionable so as to contact a given edge of the sheet to register the sheet in the strip application zone relative to the strip applicator, at least one of the crowder rollers located within the strip application zone in registration with the strip applicator, at least one of the crowder rollers having an outer surface having a noncylindrical portion, the noncylindrical portion having an increasing diameter in an upward direction relative to the conveyance plane, the noncylindrical portion providing a counteracting downward force to the respective given edge of the sheet if operation of the strip applicator causes an upward force at the respective given edge of the sheet, thereby maintaining the sheet in a substantially planar condition.

2. The assembly of claim 1, wherein the at least one crowder roller is located adjacent a first edge of the sheet, the strip applicator applying a strip parallel to the first edge.

3. The assembly of claim 1, wherein the at least one crowder roller is located adjacent a first edge of the sheet, the strip applicator applying a strip perpendicular to the first edge.

4. The assembly of claim 1, wherein both of the crowder rollers in the at least one pair of crowder rollers include a noncylindrical portion on their respective outer surfaces.

5. The assembly of claim 1, wherein the crowder rollers in the at least one pair of crowder rollers are respectively located adjacent opposite edges of the sheet.

6. The assembly of claim 1, wherein the at least one pair of crowder rollers includes a first pair of crowder rollers and a second pair of crowder rollers, the first pair of crowder rollers including a first crowder roller positionable in a predetermined downstream position within the application zone and a second crowder roller positionable in a predetermined upstream position within the application zone, the second pair of crowder rollers including a third crowder roller positionable in a predetermined lateral position and a fourth crowder roller positionable in an alternate predetermined lateral position, the first, second, third and fourth crowder rollers contacting respectively first, second, third and fourth sides of the sheet.

7. The assembly of claim 1, wherein at least one of the crowder rollers is movable vertically to allow the sheet to be conveyed on the conveyor rollers past the crowder rollers before or after application of the strip.

8. The assembly of claim 1, wherein the conveyor rollers include a support roller in substantial registration with the strip applicator for contacting a bottom side of the sheet below the strip applicator during application of the strip.

9. The assembly of claim 8, wherein the support roller is an idler roller.

10. The assembly of claim 1, further including the strip applicator, the strip applicator being positioned in the strip application zone above the conveyor rollers for applying a strip to a sheet registered by the crowder rollers.

11. The assembly of claim 10, wherein the conveyor rollers include a support roller in registration with the strip applicator for contacting a bottom side of the sheet below the strip applicator during application of the strip, the strip applicator including at least one roller for pressing the strip onto an opposite side of the sheet in registration with the support roller.

12. The assembly of claim 10, wherein the strip applicator is movable relative to the crowder rollers and the conveyor rollers during application of the strip.

13. An assembly for stabilizing a sheet of glass during application of a strip by a strip applicator, the assembly comprising:
a series of conveyor rollers arranged so as to define a conveyor for conveying the sheet into and within a strip application zone, each conveyor roller having a central conveyance axis, the respective central conveyance axes of the conveyor rollers extending substantially parallel to each other along a conveyance plane;
one of the conveyor rollers being a support roller in substantial registration with the strip applicator for contacting a bottom side of the sheet below the strip applicator during application of the strip, the support roller providing a counteracting upward force to the bottom side of the sheet if operation of the strip applicator causes a downward force, thereby maintaining the sheet in a substantially planar condition; and
a plurality of crowder rollers, each crowder roller having a central crowder axis extending substantially perpendicular to the conveyance plane, each crowder roller being respectively positionable so as to contact a given edge of the sheet to register the sheet in the strip application zone relative to the strip applicator, at least one crowder roller located within the strip application zone.

14. The assembly of claim 13, wherein the support roller is an idler roller.

15. The assembly of claim 13, further including the strip applicator, the strip applicator being positioned in the strip application zone above the conveyor rollers for applying a strip to a sheet registered by the crowder rollers.

16. The assembly of claim 15, wherein the strip applicator includes at least one roller for pressing the strip onto an opposite side of the sheet in registration with the support roller.

17. The assembly of claim 13, wherein at least one of the crowder rollers includes an outer surface having a noncylindrical portion, the noncylindrical portion having an increasing diameter in an upward direction relative to the conveyance plane.

18. The assembly of claim 13, wherein crowder rollers are provided around the strip application zone so as to contact and register four edges of the sheet.

19. An assembly for stabilizing a sheet of glass during application of a strip by a strip applicator, the assembly comprising:

a conveyor comprising a plurality of conveyor rollers for conveying the sheet into and within a strip application zone along a conveyance plane and defining a conveyance direction;

a first crowder roller assembly comprising at least one crowder roller disposed in relation to the conveyor such that the at least one crowder roller extends through the conveyance plane and is positionable to contact a first side of the sheet upstream of the strip applicator in the conveyance direction, the first side substantially perpendicular to the conveyance direction; and a second crowder roller assembly comprising at least one crowder roller disposed in relation to the conveyor such that the at least one crowder roller extends through the conveyance plane and is positionable to contact a second side of the sheet downstream of the strip applicator in the conveyance direction, the second side opposite the first side and substantially perpendicular to the conveyance direction.

20. The assembly of claim 19, further comprising:

a third crowder roller assembly comprising at least one crowder roller disposed in relation to the conveyor such that the at least one crowder roller extends through the conveyance plane and is positionable to contact a third side of the sheet at a point substantially coincident with the strip applicator in the conveyance direction, the third side substantially parallel to the conveyance direction; and a fourth crowder roller assembly comprising at least one crowder roller disposed in relation to the conveyor such that the at least one crowder roller extends through the conveyance plane and is positionable to contact a fourth side of the sheet at a point substantially coincident with the strip applicator in the conveyance direction, the fourth side opposite the third side and substantially parallel to the conveyance direction.

\* \* \* \* \*